United States Patent
Jeon et al.

(10) Patent No.: US 10,175,293 B2
(45) Date of Patent: Jan. 8, 2019

(54) SEMICONDUCTOR DEVICE

(71) Applicant: SK hynix Inc., Gyeonggi-do (KR)

(72) Inventors: Byung-Deuk Jeon, Gyeonggi-do (KR); Sun-Jong Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 735 days.

(21) Appl. No.: 14/108,006

(22) Filed: Dec. 16, 2013

(65) Prior Publication Data

US 2015/0060855 A1 Mar. 5, 2015

(30) Foreign Application Priority Data

Aug. 30, 2013 (KR) ........................ 10-2013-0104313

(51) Int. Cl.
| | | |
|---|---|---|
| G01R 31/28 | (2006.01) | |
| G01R 31/3185 | (2006.01) | |
| G01R 31/317 | (2006.01) | |
| G11C 29/02 | (2006.01) | |
| G11C 29/12 | (2006.01) | |

(52) U.S. Cl.
CPC ... *G01R 31/2843* (2013.01); *G01R 31/31701* (2013.01); *G01R 31/318513* (2013.01); *G11C 29/022* (2013.01); *G11C 29/1201* (2013.01); *G01R 31/31717* (2013.01)

(58) Field of Classification Search
CPC .............. G11C 29/1201; G11C 29/022; G01R 31/31701; G01R 31/318513; G01R 31/31717; G01R 31/00; G01R 31/26; G01R 31/28; G01R 31/2843; H01L 22/00; H01L 24/12
See application file for complete search history.

(56) References Cited

U.S. PATENT DOCUMENTS

| | | | | |
|---|---|---|---|---|
| 8,760,901 B2* | 6/2014 | Riho | ............. | G11C 11/4076 365/189.07 |
| 8,796,863 B2* | 8/2014 | Lee | ............. | G11C 5/025 257/71 |
| 9,432,298 B1* | 8/2016 | Smith | ............. | H04L 49/9057 |
| 2005/0099199 A1* | 5/2005 | Sugita | ............. | G01B 31/31851 324/750.3 |
| 2006/0232292 A1* | 10/2006 | Shimizume | ......... | G01R 31/2812 324/750.3 |
| 2007/0236242 A1* | 10/2007 | Varadarajan | ........ | G01R 31/2884 324/754.03 |
| 2008/0048706 A1* | 2/2008 | Shimizume | ....... | G01R 31/31851 324/762.01 |
| 2008/0091994 A1* | 4/2008 | Dean | ............. | G01R 31/31850 714/724 |

(Continued)

FOREIGN PATENT DOCUMENTS

KR 1020110076692 7/2011

*Primary Examiner* — Kyle R Quigley

(74) *Attorney, Agent, or Firm* — IP & T Group LLP

(57) ABSTRACT

A semiconductor device includes a plurality of first pads, a plurality of data input and output units suitable for transmitting a data between a plurality of global lines and the plurality of first pads, respectively, a connection control unit suitable for coupling the plurality of first pads to each other in a test operation period, and a test operation unit suitable for controlling the plurality of data input and output units to transmit a test data in a set order through the plurality of first pads coupled to each other in the test operation period.

17 Claims, 3 Drawing Sheets

(56) References Cited

U.S. PATENT DOCUMENTS

| | | | |
|---|---|---|---|
| 2008/0206904 A1* | 8/2008 | McCarthy | G11C 29/006 438/15 |
| 2008/0208384 A1* | 8/2008 | McCarthy | G01R 31/31723 700/121 |
| 2009/0102503 A1* | 4/2009 | Saito | G01R 31/2812 324/750.3 |
| 2011/0084744 A1* | 4/2011 | Nishioka | G11C 7/1093 327/161 |
| 2011/0121294 A1* | 5/2011 | Koyama | G11C 29/1201 257/48 |
| 2011/0187376 A1* | 8/2011 | Barrenscheen | G01R 31/327 324/416 |
| 2012/0228669 A1* | 9/2012 | Bower | H01L 27/3255 257/103 |
| 2012/0272112 A1* | 10/2012 | Oh | H01L 23/481 714/727 |
| 2013/0094272 A1* | 4/2013 | Riho | G11C 11/4076 365/63 |
| 2014/0070838 A1* | 3/2014 | Vukic | H01L 22/14 324/762.03 |
| 2014/0197409 A1* | 7/2014 | Partsch | H01L 25/18 257/48 |

* cited by examiner

SEMICONDUCTOR DEVICE

CROSS-REFERENCE TO RELATED APPLICATIONS

The present application claims priority of Korean Patent Application No. 10-2013-0104313, filed on Aug. 30, 2013, which is incorporated herein by reference in its entirety.

BACKGROUND

1. Field

Exemplary embodiments of the present invention relate to a semiconductor device, and more particularly, a semiconductor device having bump pads.

2. Description of the Related Art

Semiconductor device designing, packaging fabrication and software may be key technologies that rapidly develop electronic devices. R&D in the field of the designing has attained high-level specification of the semiconductor device, for example, a line width of under micrometer, cells of over a million, an operation of high speed and a heat sink of large capacity. However, the semiconductor device is a relatively low-level in the field of the packaging, which limits its overall performance. For example, over 50 percent of overall signal delay of the semiconductor device may be caused in chip-to-chip packaging. It may increase to over 80 percent as the size of the device become larger, which places importance on the packaging technology for overall performance of the semiconductor device.

The emergence of digital network information era triggers growth of digital appliances and personal digital devices, in which a smaller size, higher performance and function and a lower cost are required to semiconductor devices.

Among packaging technologies, the requirements may be met by chip on chip (CoC) packaging, where a memory chip of large capacity and logic IC may be put into a package with high data transmission speed therebetween. Other packaging technologies putting the memory chip and the logic IC together into one package such as system on chip (SoC) and system in package (SiP) may not achieve the memory chip with both of the large capacity and high speed, whereas the CoC packaging may do, which may reduce manufacturing cost more than a merged DRAM technology.

The reason why the CoC packaging may achieve both of the large capacity and high speed is that the memory chip and the logic IC are stacked and connected through bump pads. According to the CoC packaging, individual memory chip may eliminate capacity limitation of the merged DRAM and increasing bit width and number of bump pads may raise the data transmission speed. The diameter of a bump pad is dozens of micrometers, which makes it easier to raise operation frequency of the semiconductor device due to good electrical characteristics of the bump pad such as low resistance, inductance, parasitic capacitance and so forth. A bump pad is a conductive bump for directly connecting chips.

For connecting the memory chip and the logic IC through the CoC packaging technology, bump pads are formed on each of the memory chip and the logic IC and the chips are put together through the formed bump pad to become one chip. After completion of the CoC packaging, operability of the memory chip is tested with data inputted and outputted through the bump pad.

FIG. 1 is a circuit diagram illustrating a bump pad test of a conventional semiconductor device.

Referring to FIG. 1, the semiconductor device includes 512 bump pads Q<0> to Q<511>, 8 probe pads DQ<0> to DQ<7>, 512 bump input and output units 10<0> to 10<511>, 8 probe input and output units 20<0> to 20<7>, 512 global input and output lines GIO<0> to GIO<511>, and 8 test data mux units MUX<0> to MUX<7>.

FIG. 1 shows as an example specific number of elements, for example the 512 bump pads, 8 probe pads, 512 bump input and output units, 512 global input and output lines and 8 test data mux units, which may be differently implemented depending on the circuit design.

The 512 bump input and output units 10<0> to 10<511> input or output 512 data DATA<0> to DATA<511> in parallel through the 512 bump pads Q<0> to Q<511>. The 512 bump input and output units 10<0> to 10<511> communicate the 512 data DATA<0> to DATA<511> with internal circuits (not illustrated) through the 512 global input and output ones GIO<0> to GIO<511>.

The 512 bump input and output units 10<0> to 10<511> and the 512 bump pads Q<0> to Q<511> are classified into 4 channels, each of which includes 128 bump input and output units and 128 bump pads, and individually performs a data input and output operation.

Channel A CH A includes first to 128th bump pads Q<0> to Q<127> and first to 128th bump input and output units 10<0> to 10<127>. Channel B CH B includes 129th to 256th bump pads Q<128> to Q<255> and 129th to 256th bump input and output units 10<128> to 10<255>. Channel C CH C includes 257th to 384th bump pads Q<256> to Q<383> and 257th to 384th bump input and output units 10<256> to 10<383>. Channel D CH D includes 385th to 512nd bump pads Q<384> to Q<511> and 385th to 512nd bump input and output units 10<384> to 10<511>.

Each of the 4 channels CH A to CH D has independence of data input and output. For example, 128 data DATA<0> to DATA<127> may be input to the channel A CH A while 128 data DATA<128> to DATA<255> are output from the channel B CH B. For example, 128 data DATA<128> to DATA<255> may be input to the channel B CH B while 128 data DATA<384> to DATA<511> are output from the channel D CH D.

The 512 bump input and output units 10<0> to 10<511> input or output the 512 data DATA<0> to DATA<511> through the 512 bump pads Q<0> to Q<511> that are formed by the CoC packaging technology and thus the size of each of 512 bump pads Q<0> to Q<511> is very small, which makes it difficult to input and output test of the 512 data DATA<0> to DATA<511> with the 512 bump pads Q<0> to Q<511> and the 512 bump input and output units 10<0> to 10<511> through a test probe of the conventional semiconductor test device.

In the conventional semiconductor device, 8 test data TDATA<0> to TDATA<7> are input through the 8 probe pads DQ<0> to DQ<7> and 8 probe input and output units 20<0> to 20<7>. The 8 test data TDATA<0> to TDATA<7> are repeatedly transmitted to the 512 global input and output lines GIO<0> to GIO<511> to test the data input and output operation between the 512 global input and output lines GIO<0> to GIO<511> and the internal circuits.

In detail, the 8 probe input and output units 20<0> to 20<7> input or output the 8 test data TDATA<0> to TDATA<7> in parallel through the 8 probe pads DQ<0> to DQ<7>. The 128 global input and output lines corresponding to one of the 4 channels CH A to CH D are divided into 8 groups, which are connected to the 8 probe input and output units 20<0> to 20<7> through the 8 test data mux units MUX<0> to MUX<7> respectively.

For the channel A CH A, the corresponding 128 global input and output lines GIO<0> to GIO<127> are divided into 8 groups GIO<0:15>, GIO<16:31>, GIO<32:47>, GIO<48:63>, GIO<64:79>, GIO<80:95>, GIO<96:111> and GIO<112:127>, which are connected to the 8 probe input and output units 20<0> to 20<7> and 8 probe pads DQ<0> to DQ<7> through the 8 test data mux units MUX<0> to MUX<7> respectively.

For the channel B CH B, the corresponding 128 global input and output lines GIO<128> to GIO<255> are divided into 8 groups GIO<128:143>, GIO<144:159>, GIO<160:175>, GIO<176:191>, GIO<192:207>, GIO<208:223>, GIO<224:239> and GIO<240:255>, which are connected to the 8 probe input and output units 20<0> to 20<7> and the 8 probe pads DQ<0> to DQ<7> through the 8 test data mux units MUX<0> to MUX<7>, respectively.

For the channel C CH C, the corresponding 128 global input and output lines GIO<256> to GIO<383> are divided into 8 groups GIO<256:271>, GIO<272:287>, GIO<288:303>, GIO<304:319>, GIO<320:335>, GIO<336:351>, GIO<352:367> and GIO<368:383>, which are connected to the 8 probe input and output units 20<0> to 20<7> and the 8 probe pads DQ<0> to DQ<7> through the 8 test data mux units MUX<0> to MUX<7>, respectively.

For the channel D CH D, the corresponding 128 global input and output lines GIO<384> to GIO<511> are divided into 8 groups GIO<384:399>, GIO<400:415>, GIO<416:431>, GIO<432:447>, GIO<448:463>, GIO<464:479>, GIO<480:495> and GIO<496:511>, which are connected to the 8 probe input and output units 20<0> to 20<7> and the 8 probe pads DQ<0> to DQ<7> through the 8 test data mux units MUX<0> to MUX<7> respectively.

As such, the 512 global input and output lines are classified into 4 groups corresponding to the 4 channels CH A to CH D, respectively, and the each group of 128 global input and output lines are divided into 8 groups connected to the 8 probe input and output units 20<0> to 20<7> and the 8 probe pads DQ<0> to DQ<7> through the 8 test data mux units MUX<0> to MUX<7>, respectively.

The 8 test data TDATA<0> to TDATA<7> are selected 16 times and transmitted through the 8 test data mux units MUX<0> to MUX<7> to each of the 4 channels CH A to CH D, that is, each of the global input and output lines GIO<0:127>, GIO<128:255>, GIO<256:383> and GIO<384:511> corresponding to the respective channels CH A to CH D.

In other words, the 8 probe input and output units 20<0> to 20<7> sequentially operate 16 times, each time select 8 lines from the 128 global input and output lines GIO<0:127>, GIO<128:255>, GIO<256:383> or GIO<384:511>, and transmit the 8 test data TDATA<0> to TDATA<7> to the selected 8 global input and output lines from the 128 global input and output lines GIO<0:127>, GIO<128:255>, GIO<256:383> or GIO<384:511>.

However in the conventional semiconductor device, the 4 channels CH A to CH D share the 8 probe pads DQ<0> to DQ<7>, the 8 probe input and output units 20<0> to 20<7> and the 8 test data mux units MUX<0> to MUX<7>, and thus the 8 test data TDATA<0> to TDATA<7> may not be inputted to the 4 channels CH A to CH D at the same time.

For example, the 8 test data TDATA<0> to TDATA<7> may not be input to the 3 channels CH B to CH D while the 8 test data TDATA<0> to TDATA<7> is being input to the channel A CH A through the 128 global input and output lines GIO<0> to GIO<127> corresponding to the channel A CH A.

Therefore, it is by time-division that the 8 test data TDATA<0> to TDATA<7> are input to each of the global input and output lines GIO<0:127>, GIO<128:255>, GIO<256:383> and GIO<384:511> corresponding to the respective channels CH A to CH D through the shared 8 probe pads DQ<0> to DQ<7>, the shared 8 probe input and output units 20<0> to 20<7> and the shared 8 test data mux units MUX<0> to MUX<7> which may lead to increase of test time.

Further, the conventional semiconductor device does not include a mechanism for allowing data to be input or output through the 512 bump pads Q<0> to Q<511> and the 512 bump input and output units 10<0> to 10<511>. Even though the data may be input to or output from the 512 global input and output lines GIO<0> to GIO<511> through the 8 probe pads DQ<0> to DQ<7> and the 8 probe input and output units 20<0> to 20<7>, the data may not be tested through the 512 bump pads Q<0> to Q<511> and the 512 bump input and output units 10<0> to 10<511>.

Thus, in the conventional semiconductor device at the wafer level, the 512 bump pads Q<0> to Q<511> and the 512 bump input and output units 10<0> to 10<511> may not be tested. The test may be performed after the 512 bump pads Q<0> to Q<511> are connected to external balls or pads at package level.

Such test may not detect a bump pad defect of the semiconductor device at the wafer test level, which is inefficient and leads to high cost of the test.

SUMMARY

Various exemplary embodiments are directed to a test circuit that may test a semiconductor device having bump pads by minimizing test time.

Various exemplary embodiments are further directed to a test circuit that may detect a bump pad defect of a semiconductor device having bump pads at a wafer test level.

In an embodiment of the present invention, a semiconductor device may include a plurality of first pads, a plurality of data input and output units suitable for transmitting a data between a plurality of global lines and the plurality of first pads, respectively, a connection control unit suitable for coupling the plurality of first pads to each other in a test operation period, and a test operation unit suitable for controlling the plurality of data input and output units to transmit a test data in a set order through the plurality of first pads coupled to each other in the test operation period.

In another embodiment of the present invention, a semiconductor device may include a plurality of groups of bump pads, a plurality of groups of data input and output units suitable for transmitting a data between global input and output lines and the bump pads, respectively, wherein the groups of data input and output units correspond to the groups of bump pads, a connection control unit suitable for coupling bump pads of the same group in a test operation period, and a test operation unit suitable for controlling data input and output units of the same group to sequentially transmit a test data through coupled bump pads of the same group corresponding thereto in the test operation period.

In accordance with the embodiments of the present invention, a test data is applied through a probe pad and rotationally inputted to bump pads connected to one another. Thus, the data input and output test may be performed for the bump pads at a wafer level of the semiconductor device Further, test time may be minimized by rotationally inputting the test data, which is applied through a probe pad.

DETAILED DESCRIPTION

Figure 1:
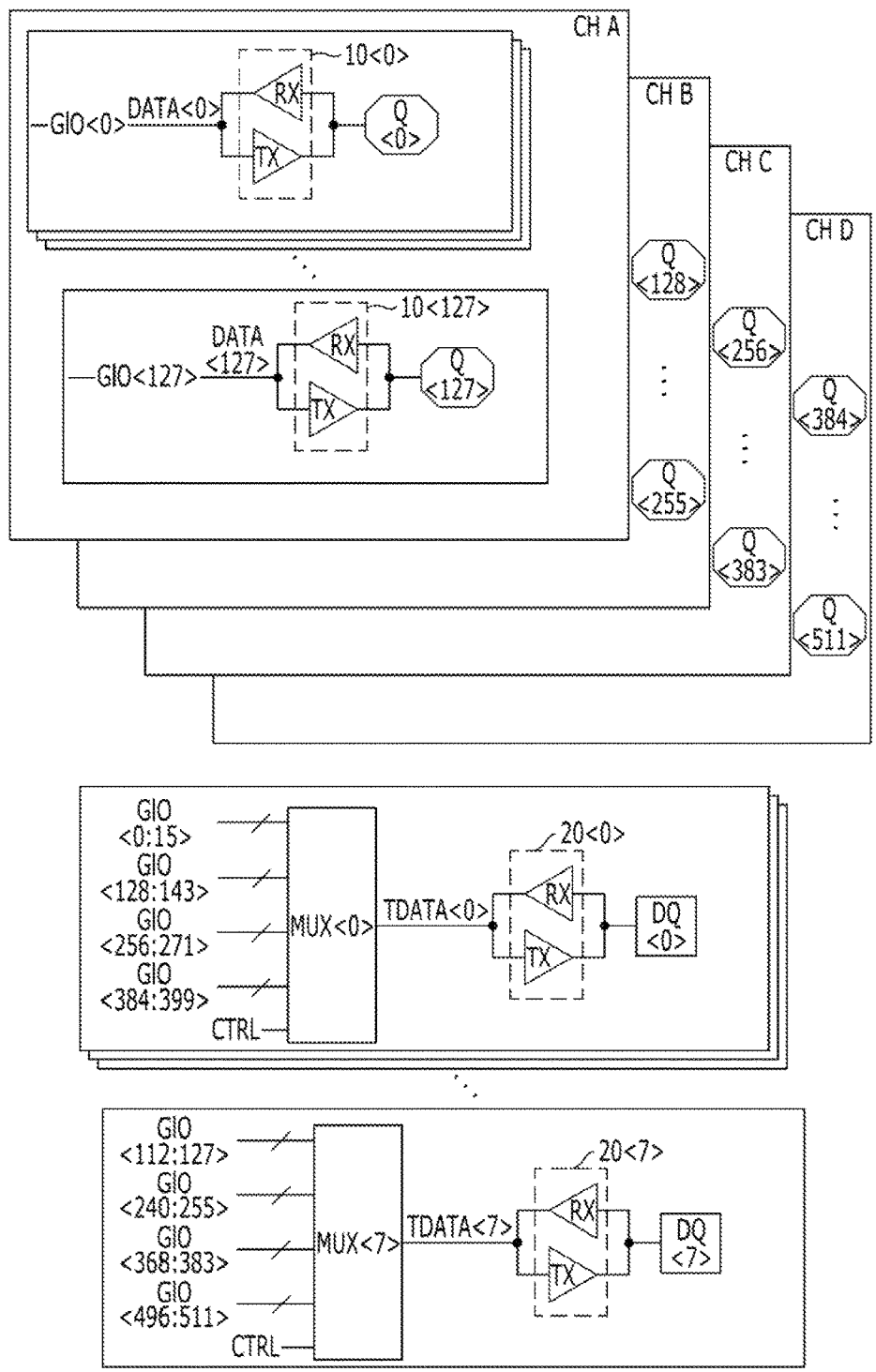
FIG. 1 is a circuit diagram illustrating a bump pad test of a conventional semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
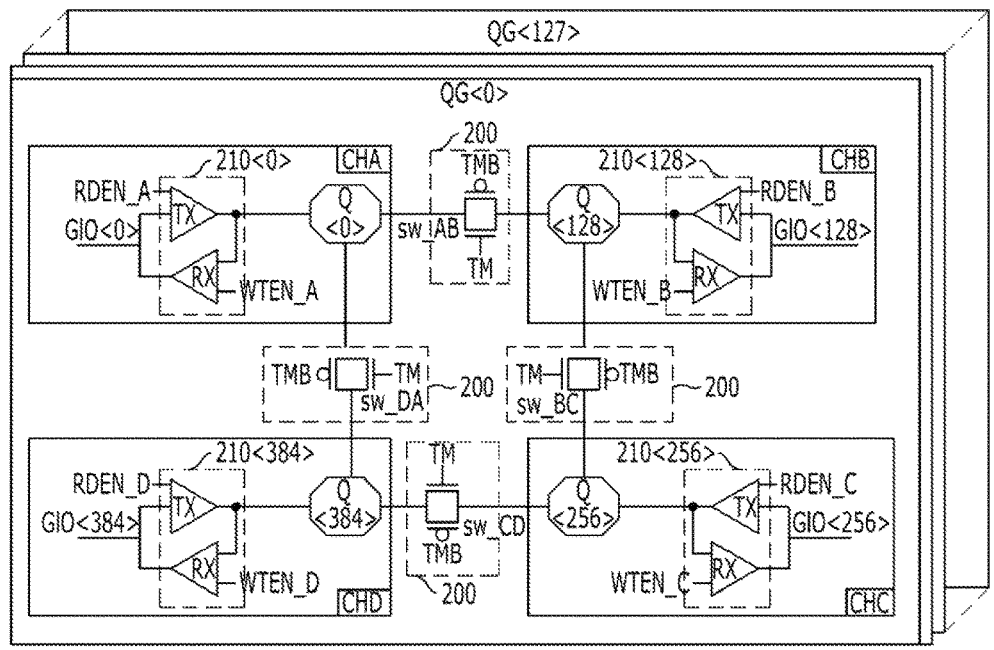
FIG. 2 is a circuit diagram illustrating a bump pad test of a semiconductor device in accordance with an embodiment of the present invention.
Figure 2:
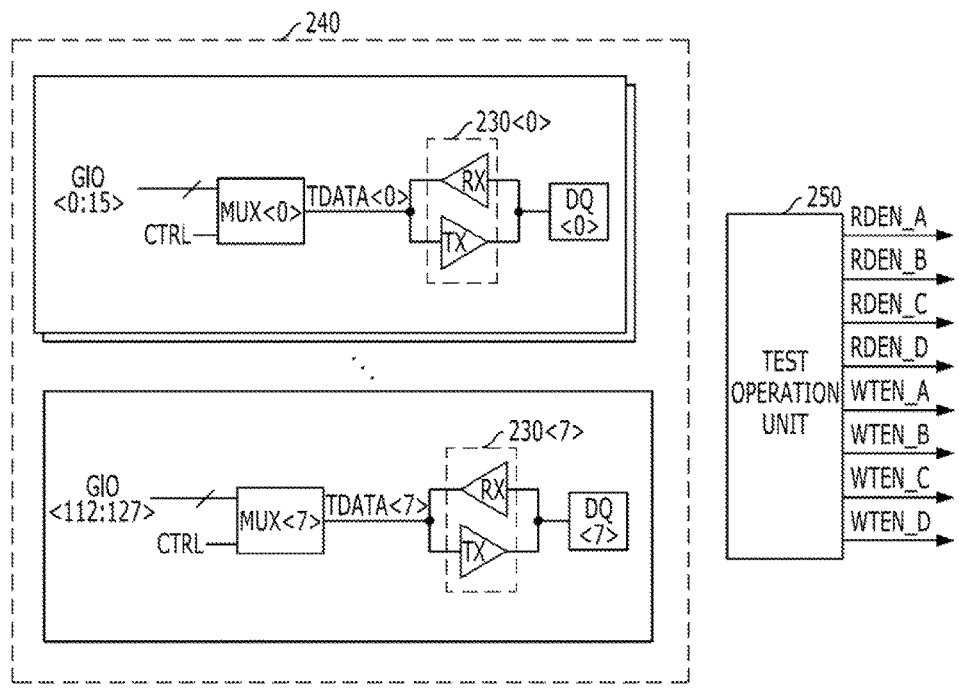

FIG. 2 is a circuit diagram illustrating a bump pad test of a semiconductor device in accordance with an embodiment of the present invention.

Referring to FIG. 2, the semiconductor device may include 512 bump pads Q<0> to Q<511>, 512 bump input and output units 210<0> to 210<511>, 512 global input and output lines GIO<0> to GIO<511>, a test data providing unit 240, a connection control unit 200, and a test operation unit 250. The test data providing unit 240 may include 8 probe pads DQ<0> to DQ<7>, 8 probe input and output units 230<0> to 230<7>, and 8 test data mux units MUX<0> to MUX<7>.

FIG. 2 shows as an example specific number of elements for example the 512 bump pads, 8 probe pads, 512 bump input and output units, 512 global input and output lines and 8 test data mux units, which may be differently implemented depending on the circuit design.

The 512 bump input and output units 210<0> to 210<511> may input or output 512 data DATA<0> to DATA<511> in parallel through the 512 bump pads Q<0> to Q<511>. The 512 bump input and output units 210<0> to 210<511> may communicate the 512 data DATA<0> to DATA<511> with internal circuits (not illustrated) through the 512 global input and output lines GIO<0> to GIO<511>.

The 512 bump input and output units 210<0> to 210<511> and the 512 bump pads Q<0> to Q<511> may be classified into 4 channels, each of which includes 128 bump input and output units and 128 bump pads, and individually performs a data input and output operation.

Channel A CH A may include first to 128th bump pads Q<0> to Q<127> and first to 128th bump input and output units 210<0> to 210<127>. Channel B CH B may include 129th to 256th bump pads Q<128> to Q<255> and 129th to 256th bump input and output units 210<128> to 210<255>. Channel C CH C may include 257th to 384th bump pads Q<256> to Q<383> and 257th to 384th bump input and output units 210<256> to 210<383>. Channel D CH D may include 385th to 512nd bump pads Q<384> to Q<511> and 385th to 512nd bump input and output units 210<384> to 210<511>.

Each of the 4 channels CH A to CH D may have independence of data input and output. For example, 128 data DATA<0> to DATA<127> may be input to the channel A CH A while 128 data DATA<128> to DATA<255> may be output from the channel B CH B. For example, 128 data DATA<128> to DATA<255> may be input to the channel B CH B while 128 data DATA<384> to DATA<511> may be output from the channel D CH D.

The connection control unit 200 in the test mode may concatenate 4 bump pads Q<0:127>, Q<128:255>, Q<256:383> and Q<384:511> included in each of 128 groups QG<0> to QG<127> of the 512 bump pads Q<0> to Q<511>. The 512 bump pads Q<0> to Q<511> may be classified into the 128 groups QG<0> to QG<127> according to the 4 channels CH A to CH D. Each of the 128 groups QG<0> to QG<127> of the 512 bump pads Q<0> to Q<511> may include 4 bump pads which belong to the 4 channels CH A to CH D, respectively. The connection control unit 200 in normal operation mode may not concatenate the bump pads.

For example, the first bump pad group QG<0> of the 128 groups QG<0> to QG<127> of the 512 bump pads Q<0> to Q<511> may include the first bump pad Q<0> from the channel A CH A, the first bump pad Q<128> from the channel B CH B, the first bump pad Q<256> from the channel C CH C and the first bump pad Q<384> from the channel D CH D.

During the test mode where test signals TM and TMB may be enabled, 4 switches SW_AB, SW_BC, SW_CD and SW_DA disposed between the 4 first bump pads Q<0>, Q<128>, Q<256> and Q<384> may be turned on, and thus the 4 first bump pads Q<0>, Q<128>, Q<256> and Q<384> may be concatenated.

During the normal operation mode where the test signals TM and TMB may be disabled, 4 switches SW_AB, SW_BC, SW_CD and SW_DA disposed between the 4 first bump pads Q<0>, Q<128>, Q<256> and Q<384> may be turned off and thus the 4 first bump pads Q<0>, Q<128>, Q<256> and Q<384> may not be concatenated.

For example, the second bump pad group QG<1> of the 128 groups QG<0> to QG<127> of the 512 bump pads Q<0> to Q<511> may include the second bump pad Q<1> from the channel A CH A, the second bump pad Q<129> from the channel B CH B, the second bump pad Q<257> from the channel C CH C, and the second bump pad Q<385> from the channel D CH D.

During the test mode where test signals TM and TMB may be enabled, 4 switches SW_AB, SW_BC, SW_CD and SW_DA disposed between the 4 second bump pads Q<1>, Q<129>, Q<257> and Q<385> may be turned on, and thus the 4 second bump pads Q<1>, Q<129>, Q<257> and Q<385> may be concatenated.

During the normal operation mode where the test signals TM and TMB may be disabled, 4 switches SW_AB, SW_BC, SW_CD and SW_DA disposed between the 4 second bump pads Q<1>, Q<129>, Q<257> and Q<385> may be turned off, and thus the 4 second bump pads Q<1>, Q<129>, Q<257> and Q<385> may not be concatenated.

Such grouping and concatenation structure as the 4 first bump pads Q<0>, Q<128>, Q<256> and Q<384> of the first bump pad group QG<0> of the 128 groups QG<0> to QG<127> of the 512 bump pads Q<0> to Q<511> and the 4 second bump pads Q<1>, Q<129>, Q<257> and Q<385> of the second bump pad group QG<1> of the 128 groups QG<0> to QG<127> of the 512 bump pads Q<0> to Q<511> may also be similarly applied to the other 126 groups QG<2> to QG<127> of the 512 bump pads Q<0> to Q<511>.

FIG. 2 illustrates the 4 switches SW_AB SW_BC, SW_CD and SW_DA in the form of pass gates, which may vary depending to the circuit design. Also, FIG. 2 illustrates the 4 switches SW_AB, SW_BC, SW_CD and SW_DA controlled by the non-inverted test signal TM that may be enabled to logic HIGH and disabled to logic LOW and the inverted test signal TMB that may be enabled to logic LOW and disabled to logic HIGH, which also may vary depending on the circuit design.

The test data providing unit 240 may receive the 8 test data TDATA<0> to TDATA<7> through the 8 probe pads DQ<0> to DQ<7>, the 8 probe input and output units 230<0> to 230<7> and the 8 test data mux units MUX<0> to MUX<7> and repeatedly transmit the received 8 test data TDATA<0> to TDATA<7> to the 128 global input and output lines GIO<0:127> corresponding to the channel A CH A from the 512 global input and output lines GIO<0> to GIO<511>.

In other words, similar to the 512 bump pads Q<0> to Q<511> and the 512 bump input and output units 210<0> to 210<511> divided into 4 groups corresponding to the 4 channels CH A to CH D, respectively, the 512 global input and output lines GIO<0> to GIO<511> may be divided into the 4 groups of the 128 global input and output lines GIO<0:127>, GIO<128:255>, GIO<256:383> and GIO<384:511> respectively corresponding to the 4 channels CH A to CH D. The test data providing unit 240 may repeatedly copy and transmit the 8 test data TDATA<0> to TDATA<7> to one of the 4 groups of the 128 global input and output lines GIO<0:127> GIO<128:255>, GIO<256:383> and GIO<384:511> respectively corresponding to the 4 channels CH A to CH D.

To repeatedly copy and transmit the 8 test data TDATA<0> to TDATA<7> may mean that the 8 test data TDATA<0> to TDATA<7> are sequentially transmitted 16 times per one of the 4 groups of the 128 global input and output lines GIO<0:127>, GIO<128:255>, GIO<256:383> and GIO<384:511> respectively corresponding to the 4 channels CH A to CH D.

When the 8 test data TDATA<0> to TDATA<7> have various preset data patterns for each of the 4 groups of the 128 global input and output lines GIO<0:127>, GIO<128:255>, GIO<256:383> and GIO<384:511> respectively corresponding to the 4 channels CH A to CH D, it may be easy to detect a defect. The preset data patterns of the 8 test data TDATA<0> to TDATA<7> may vary depending of the circuit design.

FIG. 2 illustrates the 8 test data TDATA<0> to TDATA<7> repeatedly transferred through the 128 global input and output lines GIO<0> to GIO<127> corresponding to the channel A CH A.

During the test, the test data providing unit 240 may transfer the 8 test data TDATA<0> to TDATA<7> through one (FIG. 2 illustrates the GIO<0:127>) of the 4 groups of the 128 global input and output lines GIO<0:127>, GIO<128:255>, GIO<256:383> and GIO<384:511> respectively corresponding to the 4 channels CH A to CH D The test operation unit 250 in the test mode may pass the 8 test data TDATA<0> to TDATA<7> in a preset order through the 4 bump pads Q<0:127>, Q<128:255>, Q<256:383> and Q<384:511> included in each of 128 groups QG<0> to QG<127> of the 512 bump pads Q<0> to Q<511>.

The test operation unit 250 for that operation may control the 4 bump pads Q<0:127>, Q<128:255>, Q<256:383> and Q<384:511> and the 4 bump input and output units 210<0:127>, 210<128:255>, 210<256:383> and 210<384:511> included in each of 128 groups QG<0> to QG<127> of the 512 bump pads Q<0> to Q<511> so that the 4 bump input and output units 210<0:127>, 210<128:255>, 210<256:383> and 210<384:511> may input or output in a preset order the 8 test data TDATA<0> to TDATA<7>.

For example, after completion of operation of the test data providing unit 240 in the test mode and before start of operation of the test operation unit 250 in the test mode, the 8 test data TDATA<0> to TDATA<7> are on the first one GIO<0:127> of the 4 groups of the 128 global input and output lines GIO<0:127>, GIO<128:255>, GIO<256:383> and GIO<384:511> respectively corresponding to the 4 channels CH A to CH D.

The test operation unit 250 may enable transmitters TXs of the first bump input and output unit 210<0:127> of the 4 bump input and output units 210<0:127>, 210<128:255>, 210<256:383> and 210<384:511> to output the 8 test data TDATA<0> to TDATA<7> currently on the first one GIO<0:127> of the 4 groups of the 128 global input and output ones GIO<0:127> GIO<128:255> GIO<256:383> and GIO<384:511> respectively corresponding to the 4 channels CH A to CH D to the first bump pad Q<0:127> of the 4 bump pads Q<0:127>, Q<128:255>, Q<256:383> and Q<384:511> included in each of 128 groups QG<0> to QG<127> of the 512 bump pads Q<0> to Q<511>.

As described above, the connection control unit 200 in the test mode may concatenate 4 bump pads Q<0:127>, Q<128:255>, Q<256:383> and Q<384:511> included in each of 128 groups QG<0> to QG<127> of the 512 bump pads Q<0> to Q<511>. Therefore, the 8 test data TDATA<0> to TDATA<7> outputted from the first bump pad Q<0:127> may be inputted to the second bump input and output unit 210<128:255> through the second bump pad Q<128:255>.

The test operation unit 250 at the time of input to the second bump pad Q<128:255> may enable receivers RXs of the second bump input and output unit 210<128:255> of the 4 bump input and output units 210<0:127>, 210<128:255>, 210<256:383> and 210<384:511> to output the 8 test data TDATA<0> to TDATA<7> to the second one GIO<128:255> of the 4 groups of the 128 global input and output lines GIO<0:127>, GIO<128:255>, GIO<256:383> and GIO<384:511> respectively corresponding to the 4 channels CH A to CH D.

Next, the test operation unit 250 may enable transmitters TXs of the second bump input and output unit 210<128:255> of the 4 bump input and output units 210<0:127>, 210<128:255>, 210<256:383> and 210<384:511> to output the 8 test data TDATA<0> to TDATA<7> to the second bump pad Q<128:255> of the 4 bump pads Q<0:127>, Q<128:255>, Q<256:383> and Q<384:511> included in each of 128 groups QG<0> to QG<127> of the 512 bump pads Q<0> to Q<511>.

As described above, the connection control unit 200 in the test mode may concatenate 4 bump pads Q<0:127>, Q<128:255>, Q<256:383> and Q<384:511> included in each of 128 groups QG<0> to QG<127> of the 512 bump pads Q<0> to Q<511>. Therefore, the 8 test data TDATA<0> to TDATA<7> outputted from the second bump pad Q<128:255> may be inputted to the third bump input and output unit 210<256:383> through the third bump pad Q<256:383>.

The test operation unit 250 at the time of input to the third bump pad Q<256:383> may enable receivers RXs of the third bump input and output unit 210<256:383> of the 4 bump input and output units 210<0:127>, 210<128:255>, 210<256:383> and 210<384:511> to output the 8 test data TDATA<0> to TDATA<7> to the third one GIO<255:383> of the 4 groups of the 128 global input and output lines GIO<0:127>, GIO<128:255>, GIO<256:383> and GIO<384:511> respectively corresponding to the 4 channels CH A to CH D.

Next, the test operation unit 250 may enable transmitters TXs of the third bump input and output unit 210<256:383> of the 4 bump input and output units 210<0:127>, 210<128:255>, 210<256:383> and 210<384:511> to output the 8 test data TDATA<0> to TDATA<7> to the third bump pad Q<256:383> of the 4 bump pads Q<0:127>, Q<128:255>, Q<256:383> and Q<384:511> included in each of 128 groups QG<0> to QG<127> of the 512 bump pads Q<0> to Q<511>.

As described above, the connection control unit 200 in the test mode may concatenate 4 bump pads Q<0:127>, Q<128:255>, Q<256:383> and Q<384:511> included in each of 128 groups QG<0> to QG<127> of the 512 bump pads Q<0> to Q<511>. Therefore the 8 test data TDATA<0> to TDATA<7> outputted from the third bump pad Q<256:383> may be inputted to the fourth bump input and output unit 210<384:511> through the fourth bump pad Q<384:511>.

The test operation unit 250 at the time of input to the fourth bump pad Q<384:511> may enable receivers RXs of the fourth bump input and output unit 210<384:511> of the 4 bump input and output units 210<0:127>, 210<128:255>, 210<256:383> and 210<384:511> to output the 8 test data TDATA<0> to TDATA<7> to the fourth one GIO<384:511> of the 4 groups of the 128 global input and output lines GIO<0:127>, GIO<128:255>, GIO<256:383> and GIO<384:511> respectively corresponding to the 4 channels CH A to GHQ.

Next, the test operation unit 250 may enable transmitters TXs of the fourth bump input and output unit 210<384:511> of the 4 bump input and output units 210<0:127>, 210<128:255>, 210<256:383> and 210<384:511> to output the 8 test data TDATA<0> to TDATA<7> to the fourth bump pad Q<384:511> of the 4 bump pads Q<0:127>, Q<128:255>, Q<256:383> and Q<384:511> included in each of 128 groups QG<0> to QG<127> of the 512 bump pads Q<0> to Q<511>.

As described above, the connection control unit 200 in the test mode may concatenate 4 bump pads Q<0:127>, Q<128:255>, Q<256:383> and Q<384:511> included in each of 128 groups QG<0> to QG<127> of the 512 bump pads Q<0> to Q<511>. Therefore, the 8 test data TDATA<0> to TDATA<7> outputted from the fourth bump pad Q<384:511> may be inputted to the first bump input and output unit 210<0:127> through the first bump pad Q<0:127>.

The test operation unit 250 at the time of input to the first bump pad Q<0:127> may enable receivers RXs of the first bump input and output unit 210<0:127> of the 4 bump input and output units 210<0:127>, 210<128:255>, 210<256:383> and 210<384:511> to output the 8 test data TDATA<0> to TDATA<7> to the first one GIO<0:127> of the 4 groups of the 128 global input and output lines GIO<0:127>, GIO<128:255>, GIO<256:383> and GIO<384:511> respectively corresponding to the 4 channels CH A to CH D.

The test operation unit 250 may adjust values of control signals RDEN_A, RDEN_B, RDEN_C, RDEN_D, WTEN_A, WTEN_B, WTEN_C and WTEN_D, which may control each of the 4 bump input and output units 210<0:127>, 210<128:255>, 210<256:383> and 210<384:511> to operate in a preset order.

Even though not illustrated in FIG. 2, the test operation unit 250 may perform operation in response to control signals, which are externally defined and inputted directly from the outside or internally preset and inputted from a mode register set (MRS).

As described above, the test operation unit 250 may sequentially pass the 8 test data TDATA<0> to TDATA<7> through the 4 bump pads Q<0:127>, Q<128:255>, Q<256:383> and Q<384:511> and the 4 bump input and output units 210<0:127>, 210<128:255>, 210<256:383> and 210<384:511> included in each of 128 groups QG<0> to QG<127> of the 512 bump pads Q<0> to Q<511>.

When all of concatenated input and output operations of the 8 test data TDATA<0> to TDATA<7> are completed, the 8 test data TDATA<0> to TDATA<7> are again on the first one GIO<0:127> of the 4 groups of the 128 global input and output lines GIO<0:127>, GIO<128:255>, GIO<256:383> and GIO<384:511> respectively corresponding to the 4 channels CH A to CH D.

The test data providing unit 240 may output the 8 test data TDATA<0> to TDATA<7> currently again on the first one GIO<0:127> of the 4 groups of the 128 global input and output lines GIO<0:127>, GIO<128:255>, GIO<256:383> and GIO<384:511> respectively corresponding to the 4 channels CH A to CH D to the 8 probe pads DQ<0> to DQ<7>, thereby detecting defects in the 4 bump pads Q<0:127>, Q<128:255>, Q<256:383> and Q<384:511> and the 4 bump input and output units 210<0:127>, 210<128:255>, 210<256:383> and 210<384:511> included in each of 128 groups QG<0> to QG<127> of the 512 bump pads Q<0> to Q<511> at the outside of the semiconductor device.

For each of the 128 groups QG<0> to QG<127> of the 512 bump pads Q<0> to Q<511>, the bump pads in the semiconductor device may be detected to have defects, for example, when the test data outputted from one or more of the 128 groups QG<0> to QG<127> of the 512 bump pads Q<0> to Q<511> is determined to be different from the test data on the first one GIO<0:127> of the 4 groups of the 128 global input and output lines GIO<0:127>, GIO<128:255>, GIO<256:383> and GIO<384:511> respectively corresponding to the 4 channels CH A to CH D.

According to the embodiment of the present invention, it may also be detected which one of the 128 groups QG<0> to QG<127> of the 512 bump pads Q<0> to Q<511> may have the defects, which may provide a basis for an easy and rapid fix of the defects.

It may be determined that there may be no defect of the bump pads in the semiconductor device when the test data output from the 128 groups QG<0> to QG<127> of the 512 bump pads Q<0> to Q<511> is determined to be identical to the test data on the first one GIO<0:127>, of the 4 groups of the 128 global input and output lines GIO<0:127>, GIO<128:255>, GIO<256:383> and GIO<384:511> respectively corresponding to the 4 channels CH A to CH D.

Figure 3:
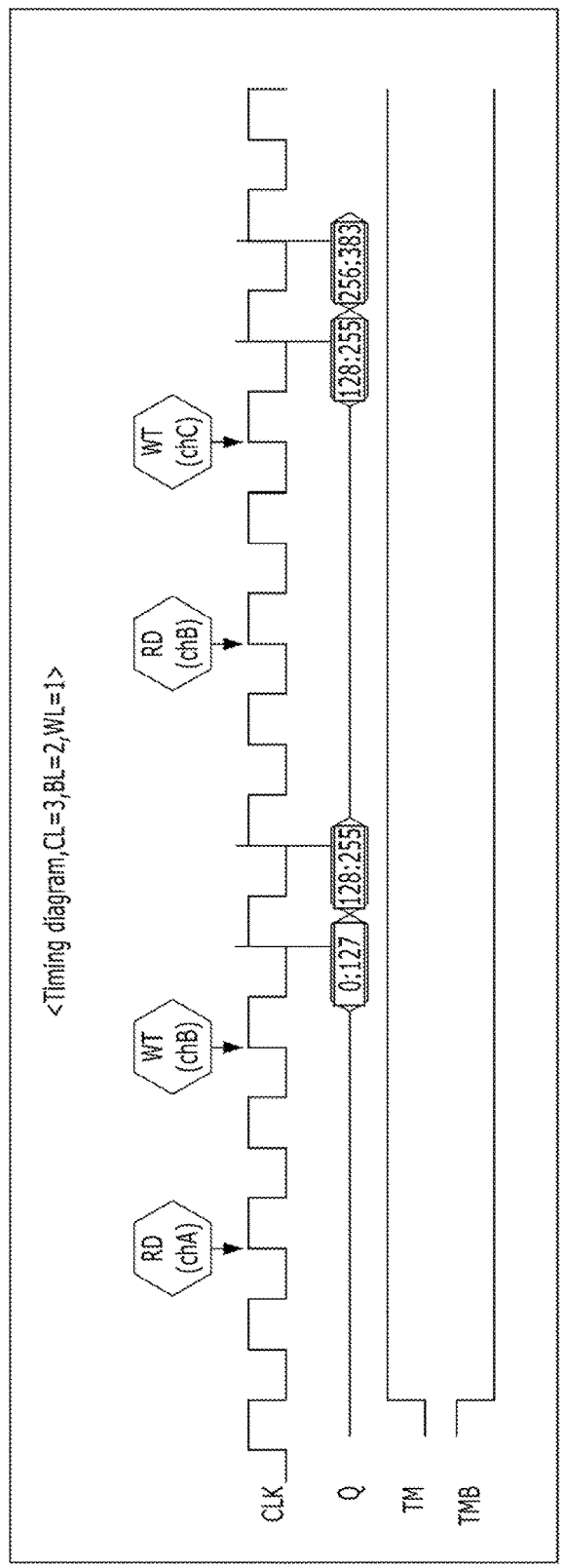
FIG. 3 is a timing diagram illustrating the bump pad test of the semiconductor device shown in FIG. 2.

FIG. 3 is a timing diagram illustrating a bump pad test of a semiconductor device shown in FIG. 2.

Referring to FIGS. 2 and 3, it is shown that the 8 test data TDATA<0> to TDATA<7> are sequentially and repeatedly input and output between the 512 bump pads Q<0> to Q<511> in response to a preset command.

As shown in FIG. 3, CAS Latency CL is 3 periods of the clock CLK, Burst Length BL is 2 periods of the clock CLK, and Write Latency WL is 1 period of the clock CLK. That is, the test data is output from the internal device (not illustrated) through the bump pad Q after 3 periods of the clock CLK passes from the input of the read command RD, the outputted test data is maintained for 2 periods of the clock CLK, and the inputted test data is stored into the internal device after 1 period of the dock CLK passes from the input of the write command WT.

The first read command RD may be applied to the channel A CH A and the first write command WT may be applied to the channel B CH B in order that the 8 test data TDATA<0> to TDATA<7> may be outputted from the first bump pad Q<0:127> to the second bump pad Q<128:255> among the 4 bump pads Q<0:127>, Q<128:255>, Q<256:383> and Q<384:511> included in each of 128 groups QG<0> to QG<127> of the 512 bump pads Q<0> to Q<511>.

Due to CAS Latency CL of 3 clock periods, the test data is output through the first bump pad Q<0:127> after 3 periods of the dock CLK passes from the input of the first read command RD. Due to Write Latency WL of 1 clock period, the first write command WT is applied ahead of the test data output through the first bump pad Q<0:127> by 1 clock period in order that the 8 test data TDATA<0> to TDATA<7> may be transferred from the first bump pad Q<0:127> to the second bump pad Q<128:255> among the 4 bump pads Q<0:127>, Q<128:255>, Q<256:383> and Q<384:511> included in each of 128 groups QG<0> to QG<127> of the 512 bump pads Q<0> to Q<511>.

Next, the second read command RD may be applied to the channel B CH B and the second write command WT may be applied to the channel C CH C in order that the 8 test data TDATA<0> to TDATA<7> may be outputted from the second bump pad Q<128:255> to the third bump pad Q<256:383> among the 4 bump pads Q<0:127>, Q<128:255>, Q<256:383> and Q<384:511> included in each of 128 groups QG<0> to QG<127> of the 512 bump pads Q<0> to Q<511>.

Due to CAS Latency CL of 3 clock periods, the test data is outputted through the second bump pad Q<128:255> after 3 periods of the clock CLK passes from the input of the second read command RD. Due to Write Latency WL of 1 clock period, the second write command WT is applied ahead of the test data output through the second bump pad Q<128:255> by 1 clock period before in order that the 8 test data TDATA<0> to TDATA<7> may be transferred from the second bump pad Q<128:255> to the third bump pad Q<256:383> among the 4 bump pads Q<0:127>, Q<128:255>, Q<256:383> and Q<384:511> included in each of 128 groups QG<0> to QG<127> of the 512 bump pads Q<0> to Q<511>.

Next, even though not illustrated in FIG. 3, the third read command RD may be applied to the channel C CH C and the third write command WT may be applied to the channel D CH D in order that the 8 test data TDATA<0> to TDATA<7> may be outputted from the third bump pad Q<256:383> to the fourth bump pad Q<384:511> among the 4 bump pads Q<0:127>, Q<128:255>, Q<256:383> and Q<384:511> included in each of 128 groups QG<0> to QG<127> of the 512 bump pads Q<0> to Q<511>.

Likewise, the fourth read command RD may be applied to the channel D CH D and the fourth write command WT may be applied to the channel A CH A in order that the 8 test data TDATA<0> to TDATA<7> may be outputted from the fourth bump pad Q<384:511> to the first bump pad Q<0:127> among the 4 bump pads Q<0:127>, Q<128:255>, Q<256:383> and Q<384:511> included in each of 128 groups QG<0> to QG<127> of the 512 bump pads Q<0> to Q<511>.

According to the embodiment of the present invention, the bump pads of the semiconductor device may be tested by transmitting test data, which is applied through a probe pad, at a wafer level of the semiconductor device.

Further, test time may be minimized by rotationally inputting the test data to bump pads connected to one another.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a plurality of first pads classified into a number of first pad groups;
   a plurality of data input and output units suitable for transmitting and receiving a data between a plurality of global lines and the plurality of first pads, respectively;
   a connection control unit having a plurality of switches, each switch disposed between adjacent first pads which are included in a same first pad group, wherein each switch is suitable for coupling first pads, which are included in the same first pad group, to each other during a test operation period, and not coupling the first pads included in the same first pad group during a normal operation period; and
   a test operation unit suitable for controlling the plurality of data input and output units to transmit and receive a test data in a set order through the first pads coupled to each other in the test operation period,
   wherein the plurality of first pads of the same first pad group correspond to different channels, respectively,
   wherein the test operation unit enables transmitters of the plurality of input and output units to output the test data to the plurality first pads, and enables receivers of the plurality of input and output units to receive the test data from the plurality first pads.

2. The semiconductor device of claim 1, further comprising:
   a test data providing unit suitable for transferring the test data between second pads and first global lines of the plurality of global lines corresponding to the set order in the test operation period.

3. The semiconductor device of claim 2, wherein the global lines are divided into a multiplicity of global line groups including the first global lines, respectively, and the test data transferred to the first global lines from the second pads passes through global lines included in a same global line group of the multiplicity of global line groups back to the first global lines.

4. The semiconductor device of claim 2, wherein the test operation unit controls the plurality of data input and output units to operate with a set interval in the set order,
   wherein the test operation unit controls a (K−1)th data input and output unit among the plurality of data input and output units to transfer the test data to a Kth data input and output unit among the plurality of data input and output units sequentially through a (K−1)th first pad and a Kth first pad among the plurality of first pads, the K being a natural number above 2.

5. The semiconductor device of claim 2, wherein the first pads include bump pads, and the second pads include probe pads and are connected to the first global lines by the test data providing unit.

6. The semiconductor device of claim 3, wherein the connection control unit connects first pads corresponding to the global lines included in a same global line group of the multiplicity of global line groups in a closed circuit through which the test data passes in the set order in the test operation period.

7. The semiconductor device of claim 1, wherein the connection control unit includes a plurality of switches suitable for connecting first pads adjacent to each other among the plurality of first pads in response to a test signal, and wherein the test signal is enabled in the test operation period.

8. The semiconductor device of claim 1, wherein the test data are sequentially and repeatedly input and output between the first pads included in the same first pad group.

9. A semiconductor device comprising:

a plurality of groups of bump pads;

a plurality of groups of data input and output units suitable for transmitting a data between global input and output lines and the bump pads, respectively, wherein the groups of data input and output units correspond to the groups of bump pads;

a connection control unit having a plurality of switches, each switch disposed between a pair of adjacent bump pads which are included in a same group among the plurality of groups of bump pads, wherein each switch is suitable for coupling the adjacent bump pads, which are included in the same bump pad group, to each other during a test operation period, and not coupling the adjacent bump pads included in the same bump pad group during a normal operation period; and a test operation unit suitable for controlling data input and output units included in a same group among the plurality groups of data input and output units to sequentially transmit a test data through coupled bump pads included in the same group among the plurality of groups of the bump pads corresponding thereto in the test operation period, wherein the plurality of bump pads of the same bump pad group have different channels from each other, respectively, wherein the test operation unit enables transmitters of the plurality of groups of input and output units to output the test data to the plurality groups of bump pads, and enables receivers of the plurality of groups of input and output units to receive the test data from the plurality groups of bump pads.

10. The semiconductor device of claim 9, further comprising a test data providing unit suitable for transferring the test data between probe pads and first global input and output lines of the global input and output lines in the test operation period, wherein the first global input and output lines correspond to one data input and output unit of the respective groups.

11. The semiconductor device of claim 10, wherein the test data is copied and then transferred to the first global input and output lines and the corresponding data input and output units to pass sequentially through the same group among the plurality of data input and output units and coupled bump pads, wherein the copying and transferring of the test data are repeated.

12. The semiconductor device of claim 10, wherein the test operation unit controls the data input and output units of the same group to operate with a set interval in a set order in the test operation period, wherein the test operation unit controls a (K−1)th data input and output unit to transfer the test data to a Kth data input and output unit in the same group sequentially through a (K−1)th bump pad and a Kth bump pad in the same group corresponding thereto, the K being a natural number above 2.

13. The semiconductor device of claim 10, wherein the probe pads are connected to the first global input and output lines by the test data providing unit.

14. The semiconductor device of claim 9, wherein the test data is a signal of multi bits and has a preset pattern.

15. The semiconductor device of claim 11, wherein the connection control unit connects the bump pads included in the same group of plurality of groups of the bump pads in a closed circuit through which the test data passes in the test operation period.

16. The semiconductor device of claim 9, wherein the connection control unit includes switches for connecting bump pads adjacent to each other in the same group in response to a test signal, and wherein the test signal is enabled in the test operation period.

17. The semiconductor device of claim 9, wherein the test data are sequentially and repeatedly input and output between the first pads included in the same first pad group.

* * * * *